(12) United States Patent
Chakraborty et al.

(10) Patent No.: US 8,274,206 B2
(45) Date of Patent: Sep. 25, 2012

(54) INTERDIGITATED MULTIPLE PIXEL ARRAYS OF LIGHT-EMITTING DEVICES

(75) Inventors: Arpan Chakraborty, Goleta, CA (US); Likun Shen, Goleta, CA (US); Umesh K. Mishra, Montecito, CA (US)

(73) Assignee: The Regents of the University of California, Oakland, CA (US)

( * ) Notice: Subject to any disclaimer, the term of this patent is extended or adjusted under 35 U.S.C. 154(b) by 15 days.

(21) Appl. No.: 13/045,148

(22) Filed: Mar. 10, 2011

(65) Prior Publication Data

US 2011/0156572 A1    Jun. 30, 2011

Related U.S. Application Data

(63) Continuation of application No. 12/419,788, filed on Apr. 7, 2009, now Pat. No. 7,911,126, which is a continuation of application No. 11/264,794, filed on Nov. 1, 2005, now Pat. No. 7,518,305.

(60) Provisional application No. 60/624,026, filed on Nov. 1, 2004.

(51) Int. Cl.
*H01J 1/62* (2006.01)

(52) U.S. Cl. ........................................ 313/498; 445/23

(58) Field of Classification Search .......... 313/498–512; 445/23–25
See application file for complete search history.

(56) References Cited

U.S. PATENT DOCUMENTS

| | | | |
|---|---|---|---|
| 4,724,323 A | 2/1988 | Fukaya et al. | |
| 5,173,751 A | 12/1992 | Ota et al. | |
| 5,247,533 A | 9/1993 | Okazaki et al. | |
| 5,338,944 A | 8/1994 | Edmond et al. | |
| 5,387,804 A | 2/1995 | Suzuki et al. | |
| 5,408,120 A | 4/1995 | Manabe et al. | |
| 5,523,589 A | 6/1996 | Edmond et al. | |
| 5,585,648 A | 12/1996 | Tischler | |
| 5,592,501 A | 1/1997 | Edmond et al. | |
| 5,631,190 A | 5/1997 | Negley | |
| 5,661,074 A | 8/1997 | Tischler | |
| 5,663,580 A | 9/1997 | Harris et al. | |
| 5,670,798 A | 9/1997 | Schetzina | |
| 5,739,554 A | 4/1998 | Edmond et al. | |
| 5,747,832 A | 5/1998 | Nakamura et al. | |
| 5,751,752 A | 5/1998 | Shakuda | |
| 5,862,167 A | 1/1999 | Sassa et al. | |
| 5,874,747 A | 2/1999 | Redwing et al. | |
| 5,880,491 A | 3/1999 | Soref et al. | |
| 5,900,647 A | 5/1999 | Inoguchi | |

(Continued)

FOREIGN PATENT DOCUMENTS

EP    0817283    1/1998

(Continued)

OTHER PUBLICATIONS

Korean Office Action dated Dec. 27, 2011 for Korean Application No. 10-2007-7012342.

(Continued)

*Primary Examiner* — Joseph L Williams
(74) *Attorney, Agent, or Firm* — Gates & Cooper LLP (57) ABSTRACT

The present invention discloses a plurality of interdigitated pixels arranged in an array, having a very low series-resistances with improved current spreading and improved heat-sinking. Each pixel is a square with sides of dimension l. The series resistance is minimized by increasing the perimeter of an active region for the pixels. The series resistance is also minimized by shrinking the space between a mesa and n-contact for each pixel.

23 Claims, 11 Drawing Sheets

U.S. PATENT DOCUMENTS

| | | | |
|---|---|---|---|
| 5,987,048 | A | 11/1999 | Ishikawa et al. |
| 6,028,877 | A | 2/2000 | Kimura |
| 6,046,464 | A | 4/2000 | Schetzina |
| 6,067,310 | A | 5/2000 | Hashimoto et al. |
| RE36,747 | E | 6/2000 | Manabe et al. |
| 6,072,189 | A | 6/2000 | Duggan |
| 6,072,819 | A | 6/2000 | Shakuda |
| 6,078,064 | A | 6/2000 | Ming-Jiunn et al. |
| 6,084,899 | A | 7/2000 | Shakuda |
| 6,118,801 | A | 9/2000 | Ishikawa et al. |

FOREIGN PATENT DOCUMENTS

| | | |
|---|---|---|
| GB | 2343294 | 5/2000 |
| WO | 9918617 | 4/1999 |

OTHER PUBLICATIONS

Zheng et al., "Optical Design of Large Area GaN-based LEDs," Proceedings of SPIE, 4996, 105 (2003).

Guo et al., "Current Crowding in GaN/InGaN Light Emitting Diodes on Insulating Substrates," Journal of Applied Physics, Oct. 15, 2001, vol. 90, No. 8.

Krames et al., "High-brightness AlGaInN Light-emitting Diodes," Proceedings of SPIE, 2938, 2 (2000).

Arik et al., "Chip Scale Thermal Management of High Brightness LED Packages," Proceedings of SPIE, 5530, 214 (2004).

Guo et al., "Current Crowding and Optical Saturation Effects in GaInN/GaN Light-Emitting Diodes rown on Insulating Substrates," Applied Physics Letters, vol. 78, No. 21, May 21, 2001, pp. 3337-3339.

Guo et al., "Efficiency of GaN/InGaN Light-Emitting Diodes with Interdigitated Mesa Geometry," Applied Physics Letters, Sep. 24, 2001, vol. 79, No. 13, pp. 1936-1938.

Jin et al., "GaN Microdisk Light Emitting Diodes," Applied Physics Letters, vol. 76, No. 5, Jan. 31, 2000, pp. 631-633.

Adivarahan et al., "High-Power Deep Ultraviolet Light-Emitting," Applied Physics Letters, vol. 85, No. 10, Sep. 6, 2004, pp. 1838-1840.

Moe et al., "Milliwatt Power Deep Ultraviolet Light Emitting Diodes Grown on Silicon Carbide," J. Jap. Appl. Phys., vol. 44, 2005, pp. 502-504.

Chakraborty, "Growth and Characterization of Nonpolar and Semipolar Group-III Nitrides-Based Heterostructures and Devices," Dissertation, Mar. 2006, pp. 160-182.

INTERDIGITATED MULTIPLE PIXEL ARRAYS OF LIGHT-EMITTING DEVICES

CROSS-REFERENCE TO RELATED APPLICATIONS

This application is a continuation of and commonly-assigned U.S. Utility application Ser. No. 12/419,788, filed on Apr. 7, 2009, by Arpan Chakraborty, Likun Shen and Umesh K. Mishra, entitled "INTERDIGITATED MULTIPLE PIXEL ARRAYS OF LIGHT-EMITTING DEVICES," which application is a continuation of and commonly-assigned U.S. Utility application Ser. No. 11/264,794, filed on Nov. 1, 2005, by Arpan Chakraborty, Likun Shen and Umesh K. Mishra, entitled "INTERDIGITATED MULTI-PIXEL ARRAYS FOR THE FABRICATION OF LIGHT-EMITTING DEVICES WITH VERY LOW SERIES-RESISTANCES AND IMPROVED HEAT-SINKING," which application claims the benefit under 35 U.S.C. §119(e) of co-pending and commonly-assigned U.S. Provisional Application Ser. No. 60/624,026, filed on Nov. 1, 2004, by Arpan Chakraborty, Likun Shen and Umesh K. Mishra, entitled "INTERDIGITATED MULTI-PIXEL ARRAYS FOR THE FABRICATION OF LIGHT-EMITTING DEVICES WITH VERY LOW SERIES-RESISTANCES," all of which applications are incorporated by reference herein.

STATEMENT REGARDING SPONSORED RESEARCH AND DEVELOPMENT

The present invention was made under support from the University of California, Santa Barbara, Solid State Lighting and Display Center member companies, including Stanley Electric Co., Ltd., Mitsubishi Chemical Corp., Rohm Co., Ltd., Cree, Inc., Matsushita Electric Works, Matsushita Electric Industrial Co., and Seoul Semiconductor Co., Ltd.

BACKGROUND OF THE INVENTION

1. Field of the Invention

The present invention relates to high-power light-emitting devices with very low series resistance, improved current spreading and improved heat-sinking.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Photonic semiconductor devices fall into three categories: (1) devices that convert electrical energy into optical radiation (e.g., light emitting diodes and laser diodes); (2) devices that detect optical signals (e.g., photodetectors); and (3) devices that convert optical radiation into electrical energy (e.g., photovoltaic devices and solar cells). Although all three kinds of devices have useful applications, the light-emitting device may be the most commonly recognized because of its application to various consumer products and applications A light-emitting device is a widely used semiconductor device whose main characteristic is that it emits energy in the form of light when a current flows through the device. The basic mechanisms by which light-emitting devices operate are well understood in this art and are set forth, for example, by Sze, Physics of Semiconductor Devices, 2d Edition (1981) at pages 681-703, which is incorporated by reference herein.

The wavelength of light (i.e., its color) that can be emitted by a given material of the light-emitting device is limited by the physical characteristics of that material, specifically its bandgap energy. Bandgap energy is the amount of energy that separates a lower-energy valence band and a higher energy conduction band in a semiconductor. The bands are energy states in which carriers (i.e., electrons or holes) can reside in accordance with well-known principles of quantum mechanics. The "band gap" is a range of energies between the conduction and valence bands that are forbidden to the carriers (i.e., the carriers cannot exist in these energy states). Under certain circumstances, when electrons and holes cross the bandgap and recombine, they will emit energy in the form of light. In other words, the frequency of electromagnetic radiation (i.e., the color) that can be produced by a given semiconductor material is a function of that material's bandgap energy. The full spectrum of wavelength can be covered by semiconductors.

A light-emitting device typically includes a diode structure (i.e., a p-n junction) with an active region to improve confinement of electron and hole wavefunctions for a better recombination efficiency. The active region can comprise a single quantum well and multiple quantum wells, a p-n homojunction, single heterojunction or double heterojunction, with a single or multiple quantum well structure being the most preferred. The nature of quantum wells and their advantages are generally well understood in this art as are the nature and advantages of heterojunctions with respect to homojunctions and vice versa. Accordingly, these will not be described in detail herein other than as necessary to describe the invention.

High brightness light-emitting devices involve high drive-current operation. However, large series-resistance, because of the contacts and the bulk p-regions and n-regions of the devices, results in heating. This leads to the saturation of the output power at higher continuous-wave (CW) drive-currents.

Moreover, high brightness light-emitting devices generally require very high output power. However, conventional light emitters employing semiconductor have a large turn-on voltage as well as a large series resistance because of the resistivity of the bulk p-layers and n-layers. This prevents high current operation because the device generates huge amount of heat with high input electrical power. In addition, the heat generated at higher drive currents leads to the roll-off of the output power.

What is needed, then, is a design for improved high brightness light-emitting devices. Specifically, what is needed is a light-emitting device with very low series-resistance and improved heat-sinking, effectively rendering high current operation of the device for high power light emitting. The present invention satisfies these needs via the development of a new mask design to minimize the effective series resistance, improve current spreading and also allowing better heat sinking.

SUMMARY OF THE INVENTION

The present invention discloses a plurality of interdigitated pixels arranged in an array, with very low series-resistances, improved current spreading and heat-sinking, and high brightness output.

In an exemplary embodiment, each pixel is a light emitting diode, wherein the pixels can be of any geometric shape and any size. In addition, a light emitting surface comprises either a top or bottom of the device.

Each pixel is a square with sides of dimension l. The series resistance is minimized by increasing the perimeter of an active region for the pixels. The series resistance is also minimized by shrinking the space between a mesa and n-contact for each pixel.

Heat-sinking is improved by separating the pixels by a distance.

Current spreading is improved by shrinking the pixels' size. In addition, current spreading is improved by the interdigitated pixels' geometry.

The present invention also discloses a method of fabricating a light-emitting device, comprising fabricating a plurality of interdigitated pixels arranged in an array, with very low series-resistances, improved current spreading and heat-sinking, and high brightness output. In addition, the present invention discloses a device fabricated according to this method.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

(I) Analysis For Series Resistance

Figure 1:
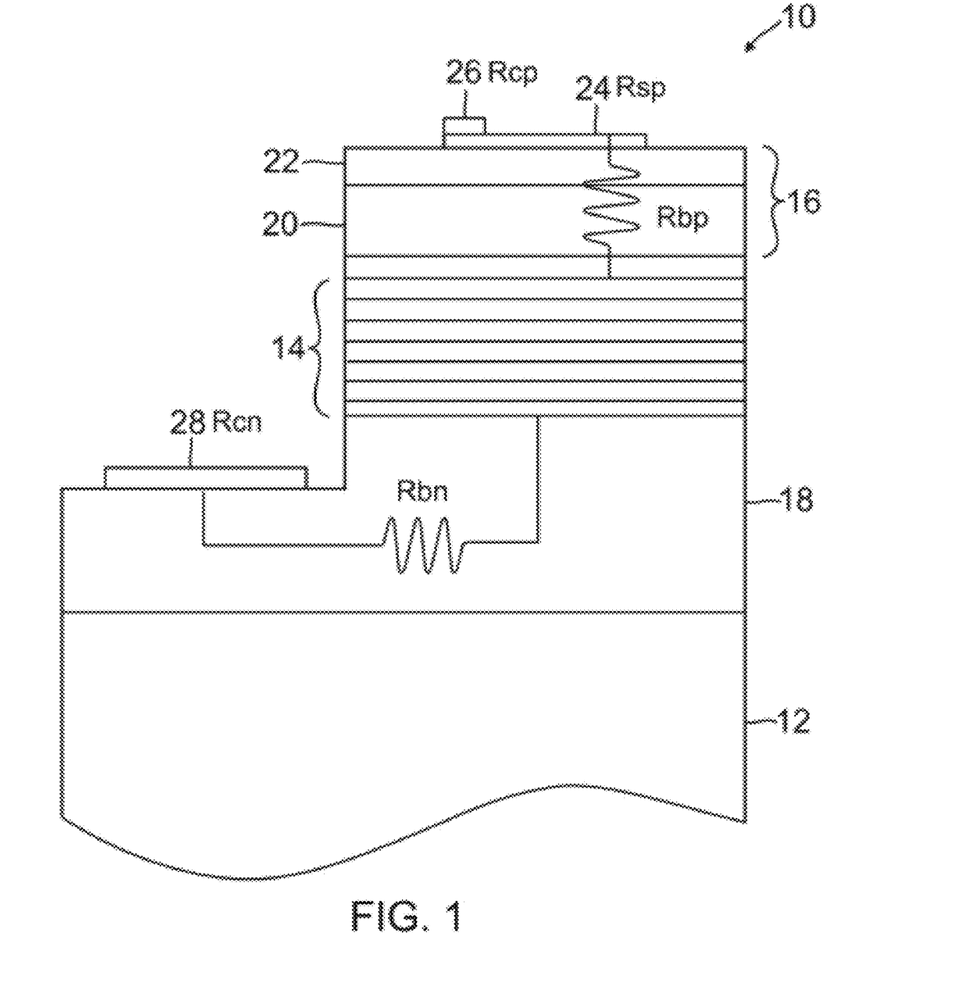
FIG. 1 is a schematic cross-section of a light emitting diode structure grown on insulating substrate, wherein the components of series resistance are depicted in the figure.

FIG. 1 illustrates a light-emitting device 10 that comprises a diode structure (i.e., a p-n junction) fabricated on a substrate or template 12 with active layers or region (such as quantum wells (QWs)) 14 embedded between p-layers or regions 16 and n-layers or regions 18. The p-layers 16 include both a p⁻ layer 20 and p⁺ layer 22. The device 10 also includes a semi-transparent p-current-spreading layer (i.e., p-contact) 24, thick p-contact 26 and n-contact 28.

For a square-shaped light-emitting device grown on an insulating substrate, such as shown in FIG. 1, with the n-contact 28 surrounding a mesa (comprised of the n-layers 18, active layers 14, p-layers 16, p-current-spreading layer 24 and p-contact 26) from three sides, the total series-resistance of the device ($R_s$) is given by the sum of the resistances from the semi-transparent p-current-spreading layer or p-contact 24 resistance ($R_{sp}$), the p-contact 26 resistance ($R_{cp}$), the p-cladding layers 16 resistance ($R_{pp}$), the n-spreading or n-cladding layer 18 resistance ($R_{bn}$) and the n-contact 28 resistance ($R_{cn}$).

For a square mesa of sides L, the total series resistance ($R_{sq}$) is given by [10]:

$$R_{sq} = \rho_{sp}/3 + \rho_{cp}/L^2 + \rho_p \cdot t_p/L^2 + \rho_{sn} \cdot (L_{sp}+\lambda)/3L + \rho_{cn}/3L$$

where, $\rho_{sp}$ is the sheet-resistance of the p-current-spreading layer 24, $\rho\rho_{cp}$ is the p-contact 26 resistance, $\rho_p$ is the resistivity of the p-cladding layers 16, $\rho_{sn}$ is the sheet-resistance of the p-layer 18, $\rho_{cn}$ is the n-contact 28 resistance, $t_p$ is the thickness of the p-cladding layers 16, $\lambda$ is the spacing between the mesa and the n-contact 28, and d is the width of the n-contact 28. $L_{sp}$ is the spreading length of the n-layer 18 given by [10]:

$$L_{sp} = [(\rho_p \cdot t_p + \rho_{cp})/(|\rho_{sp}-\rho_{sn}|)]^{1/2}$$

Figure 2:
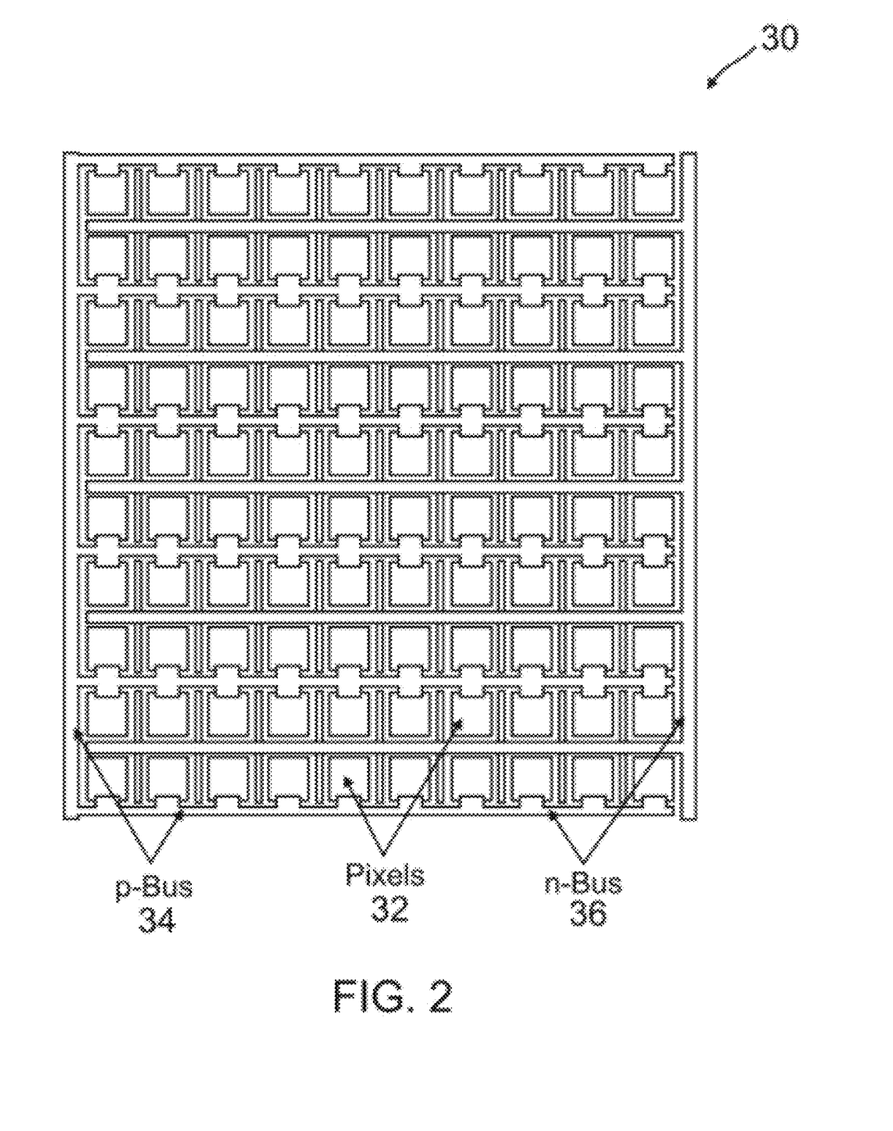
FIG. 2 is a schematic plan-view of an interdigitated multi-pixel geometry.

FIG. 2 is a schematic of an interdigitated multi-pixel array (IMPA) 30, which is comprised of a matrix of square-shaped pixels 32 of length l, and comprising N rows and columns. Each square-shaped pixel 32 allows efficient usage of the chip area compared to a circular shaped pixel as used in a micropixel design [11]. The current to the individual pixels are fed by p-bus 34 and n-bus 36 running parallel to each other. The effective active area of the device 30 is given by (N·l)². The resistance of the entire device 30 is given by the sum of the resistances of N² pixels 32 in parallel:

$$R_{MP} = [\rho_{sp}/3 + \rho_{cp}/l^2 + \rho_p \cdot t_p/l^2 + \rho_{sn} \cdot (L_{sp}+\lambda)/3l + \rho_{cn}/3l]/N^2,$$

$$\rho_{sp}/3 \cdot N^2 + \rho_{cp}/L^2 + \rho_p \cdot t_p/L^2 + \rho_{sn} \cdot (L_{sp}+\lambda)/3N \cdot L + \rho_{cn}/3N \cdot L$$

where L=N·l is the side of a single square-shaped light-emitting device with the same effective active area. Since N≧1, therefore $R_{MP} \leq R_{sq}$.

Figure 3:
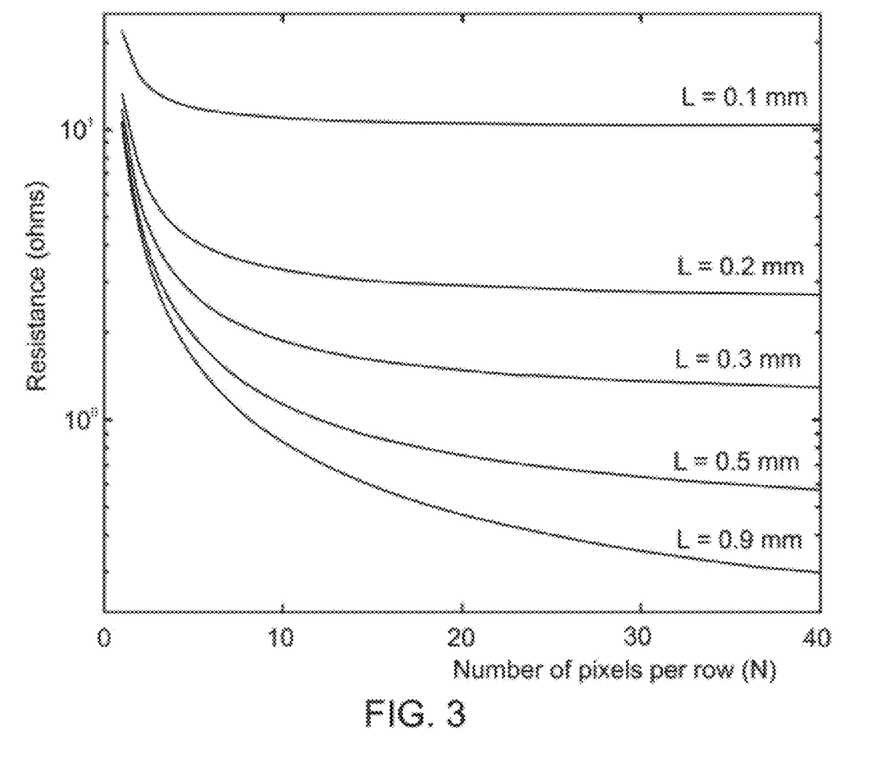
FIG. 3 is a graph illustrating the effects of the number of pixels on the series resistance of a blue light emitting device for different device dimensions.

FIG. 3 shows the decrease of the series resistance with the increase of the number of pixels per row (N) for different device dimension (L).

Table 1 summarizes the values of different parameters used in the simulations.

TABLE 1

Parameters used in the calculation of $R_s$ for a blue LED

| | |
|---|---|
| $\rho_p$ | 0.6 Ω-cm |
| $t_p$ | 200 nm |
| $\rho_c$ | $1 \times 10^{-3}$ Ω-cm² |
| $\rho_{sp}$ | 10 Ω/□ |
| $\rho_{sn}$ | 20 Ω/□ |
| $\rho_{cn}$ | $5 \times 10^{-2}$ Ω/cm |
| d | 20 μm |

TABLE 2

Chart for optimized LED design for blue LED:

| L (μm) | $N_{opt}$ | $R_s/R_{MP}$ |
|---|---|---|
| 100 | 2 | 1.4 |
| 200 | 3-4 | 2.4 |
| 300 | 6-7 | 4.9 |
| 500 | 12 | 10.8 |
| 700 | 16-20 | 18.6 |
| 900 | 21-30 | 22.9 |

The improvement in the series resistance is mainly achieved by the increase in the perimeter of the mesa. The drop in resistance rolls off for large values of N because the series resistance ($R_{MP}$) is then dominated by the sum of the terms $R_{cp}$ and $R_{bp}$ which are independent of N. The value of N for which the resistance rolls off increases with the device dimension (L).

However, the increase in the number of pixels (N) is accompanied by the increase in the total area of the die.

Figure 4A:
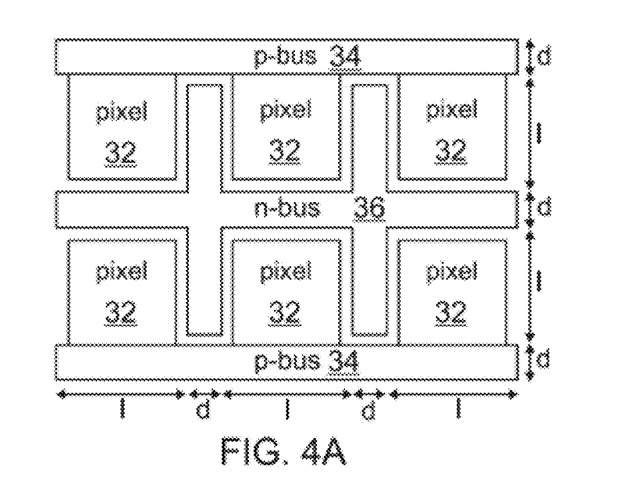
FIG. 4A is a schematic of an array of pixels forming a part of an IMPA light emitting device, wherein the dimensions of the pixel and the bus are shown.

Consider an IMPA light-emitting device as shown in FIG. 4A with N×N square pixels 32, each pixel 32 with side length of l and a spacing of d between the pixels 32. The effective die area of the IMPA light-emitting device shown in FIG. 4A is given by:

$$A_{IMPA} = [(l+d) \cdot N + d] \cdot [(2l+d+d) \cdot N/2 + d]$$

$$= [(l+d) \cdot N + d]^2$$

Figure 4B:
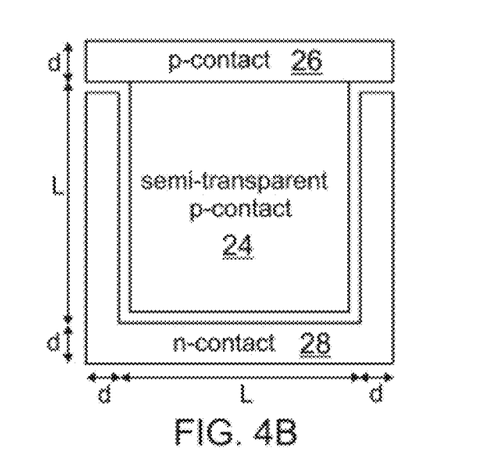
FIG. 4B is a schematic plan view of a single square-shaped light emitting device comprising a die with the dimension of the active area and the p-pads and n-pads.

However, the effective die area of a single square-shaped light-emitting device, as shown in FIG. 4B, and comprised of semi-transparent p-contact 24, thick p-contact 26 and n-contact 28, wherein the semi-transparent p-contact 24 has sides of length L and the p-contact 26 and n-contact 28 have widths of d, is given by:

$$A_{sq} = (L+2d) \cdot (L+2d)$$

$$= (L+2d)^2$$

Thus, the ratio of the effective die area of an IMPA light-emitting device and a single square light-emitting device with same effective active area ($L^2$) s given by:

$$A_{IMPA}/A_{sq} = [\{(l+d) \cdot N + d\}/\{L+2d\}]^2$$

$$= [\{l \cdot N + (N+1) \cdot d\}/\{L+2d\}]^2$$

$$A_{IMPA}/A_{sq} = [\{L+(N+1) \cdot d\}/\{L+2d\}]^2$$

Figure 5:
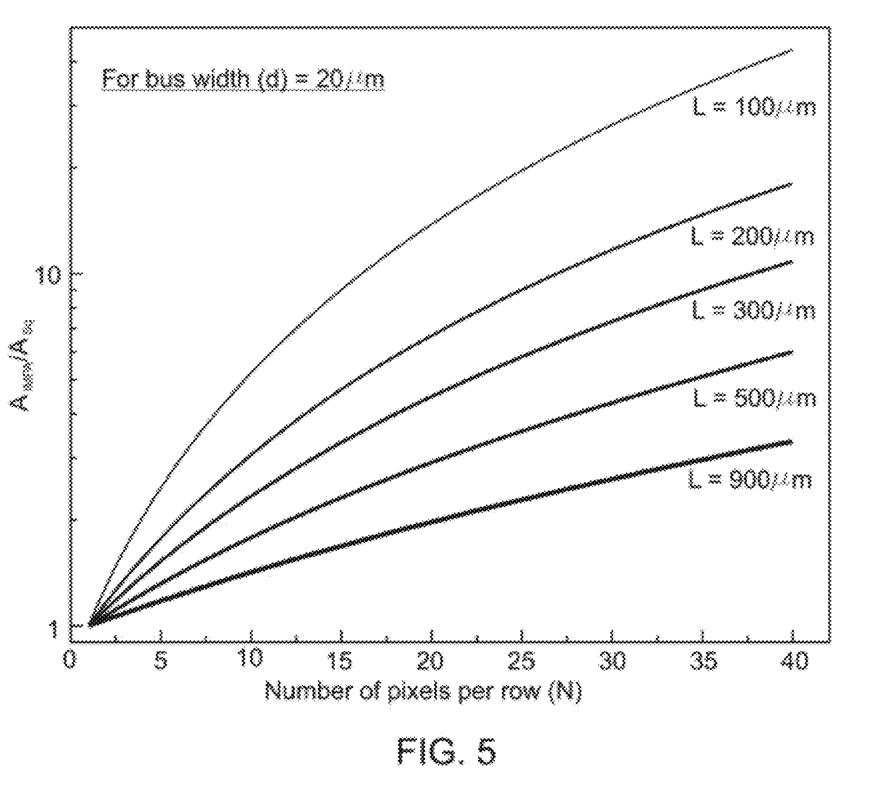
FIG. 5 is a graph illustrating the variation of the ratio of the effective die area ($A_{IMPA}/A_{sq}$) as a function of the number of pixel, for different device dimensions (L).

FIG. 5 shows the variation of the ratio of the effective die area ($A_{IMPA}/A_{sq}$) as a function of the number of pixel, for different device dimensions (L). The ratio $A_{IMPA}/A_{sq}$ increases with increase in the number of pixel per row (N=L/l). Or, in other words, the ratio increases by shrinking the size of the individual pixel. We also observe that for a fixed number of pixels (N), the ratio $A_{IMPA}/A_{sq}$ decreases with the increase in the effective active area of the device ($L^2$). Thus, the ratio will be relatively smaller (<3) for larger power chips (L>500 μm) compared to standard chips (L<500 μm).

Figure 6:
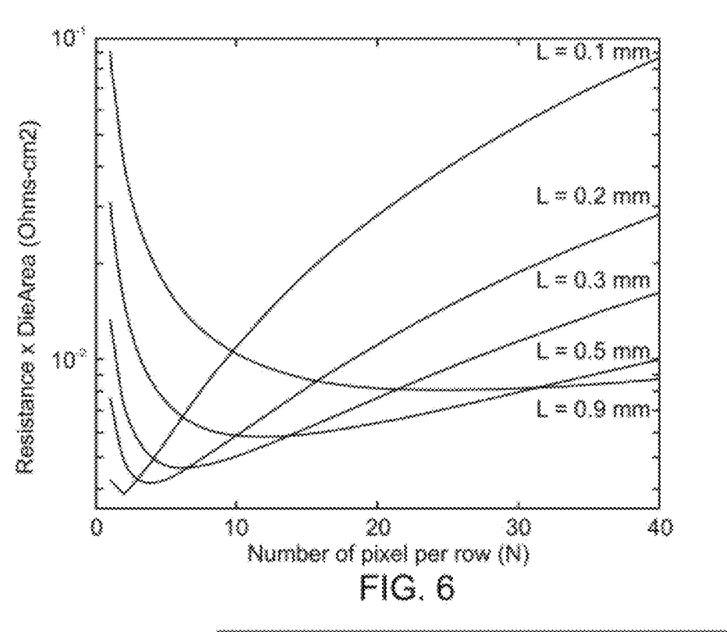
FIG. 6 is a graph that comprises a plot of the series resistance and die-area product vs. N for a blue light emitting device, to obtain the optimum number of pixel ($N_{opt}$).

Thus, we find from FIG. 3 and FIG. 5 that, for a constant effective area ($A=L^2$), the increase in N results in a decrease in the series resistance ($R_s$) of the light-emitting device but at the expense of increased effective die area. To optimize the number of pixel, we determine the value of N for which the product of the series resistance ($R_s$) and the effective die area ($A_{IMPA}$) is a minimum (see FIG. 6).

The optimum number of pixel ($N_{opt}$) for different device dimensions and the corresponding series resistance is given in Table 2.

Figure 7:
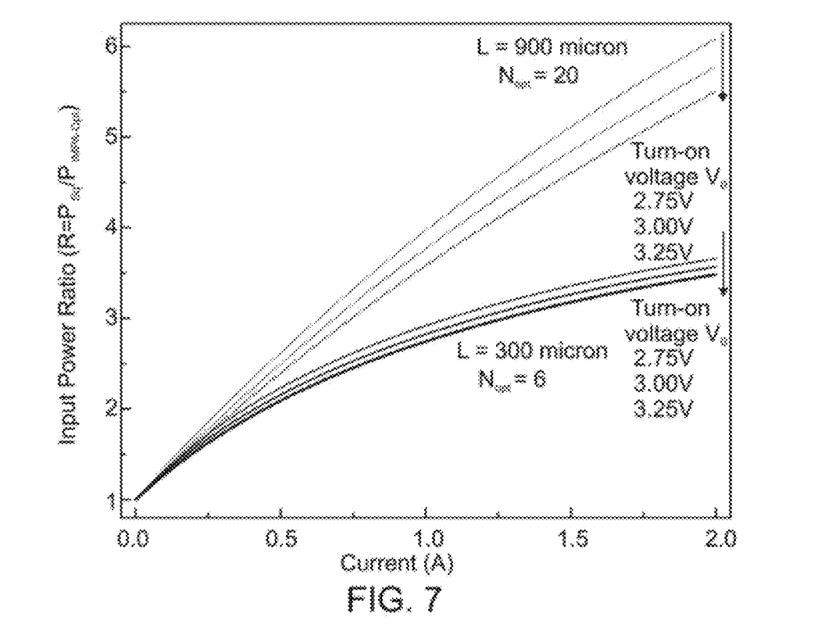
FIG. 7 is a graph illustrating the ratio of the input power of the conventional single square-shaped light emitting device and the input power of an IMPA light emitting device with the optimum number of pixel for a L=900 μm and L=300 μm.

It can be seen that the $N_{opt}$ increases with the device dimension (L). This signifies that with the increase in the device dimension, the multi-pixel design becomes increasingly beneficial. For large-area devices, the gain in the resistance by increasing the number of pixels for $N \leq N_{opt}$, is more significant than the increase in the effective die-area. The ratio of the series resistance of a single square-shaped light-emitting device to the series resistance of the IMPA light-emitting device for the optimum number of pixel is also given in Table 2. The ratio of the input power of the conventional single square-shaped light-emitting device and the input power of the IMPA light-emitting device with the optimum number of pixel for a fixed device dimension (L) is given by:

$$\Lambda = P_{sq}/P_{IMPA-opt} = (V_0 + I \cdot R_{sq})/(V_0 + I \cdot R_{IMPA})$$

wherein $V_0$ is the turn-on voltage of the light-emitting device. The input power is also equal to the heat dissipated as a result of Joule heating. The ratio, Λ, is plotted in FIG. 7 for two sets of device dimension (L) and three sets of turn-on voltage ($V_0$). It can be observed that Λ>1 and it increases with the increase in the drive current. This implies that for a fixed L, the multi-pixel design helps in lowering the input power (as well as heat dissipation due to Joule heating) more effectively for higher drive currents compared to smaller drive currents. Also, for a fixed drive current, we find that the multi-pixel geometry for a larger device helps in lowering the input power consumption more effectively than a smaller device. For example, the ratio Λ=3 signifies that for the same drive current, the IMPA light-emitting device will consume (or produce) 3 times lower electrical power (or heat) compared to a standard single square-shaped light-emitting device of same dimension (L).

(II) Analysis for Current Crowding

Figure 8:
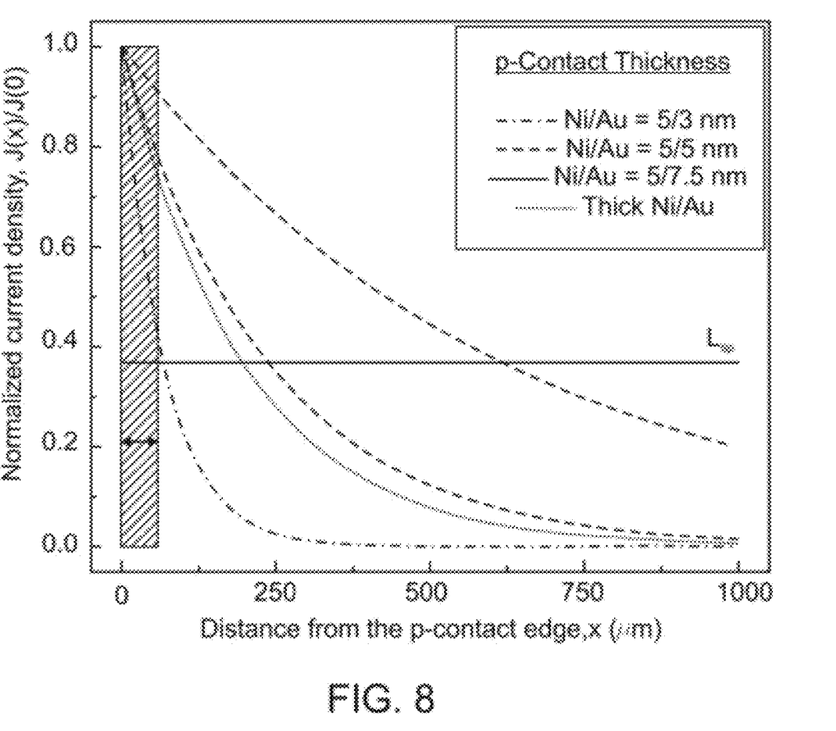
FIG. 8 is a graph illustrating the normalized current density, i.e. J(x)/J(0), as a function of the distance from the p-contact edge (x) for different p-contact layer thicknesses.

Let us analyze lateral current spreading in p-side-up mesa structure light-emitting devices with a semi-transparent p-contact. The expression for the current-density J(x) at a distance x from the p-contact edge is given by [10]:

$$J(x) = J(0) \cdot \exp(-x/L_{sp})$$

where, J(0) is the current density at the p-type contact edge and $L_{sp}$ is the length where the current density has dropped to l/e value of the current density at the p-contact edge, i.e. $J(L_{sp})/J(0) = 1/e$. $L_{sp}$ is called the current spreading length of the n-layer and for a light-emitting device with a semi-transparent p-contact, $L_{sp}$ is given by the expression [10]:

$$L_{sp} = [(\rho_p \cdot t_p + \rho_{cp})/(|\rho_{sp} - \rho_{sn}|)]^{1/2}$$

where, $\rho_p$ is the resistivity of the p-cladding layer, $t_p$ is the thickness of the p-cladding layer, $\rho_{cp}$ is the p-specific contact resistance, $\rho_{sp}$ is the sheet-resistance of the p-current-spreading layer, and $\rho_{sn}$ is the sheet-resistance of the n-layer. Using the values for the parameters given in Table 1, we plot (see FIG. 8) the normalized current density, i.e. J(x)/J(0), as a function of the distance from the p-contact edge (x) for different p-contact layer thicknesses. It can be seen from the figure that the current density drops exponentially in the lateral direction and the rate is mainly governed by the difference of the sheet resistance of the n-layer and the p-contact, i.e. ($|\rho_{sp}-\rho_{sn}|$). As the area of a single square-shaped light-emitting device increases, the current spreading length becomes much smaller compared to the device dimension ($L_{sp} \ll L$). This results in poor current spreading in the device and the light-emitting device is nonuniformly illuminated. Gao et al. [7,8] showed that the use of interdigitated mesa geometry improved current spreading in light-emitting devices. We propose the use of IMPA geometry to improve lateral current spreading in light-emitting devices. The individual pixels allows uniform current spreading by reducing the dimension of the mesa so that $L_{sp} \gg l$. The shaded region in FIG. 8 shows the current distribution inside a pixel of l. It can be seen that by decreasing the pixel size, uniform current spreading can be obtained within the pixel. This should result in uniform illumination of the entire light-emitting device.

(III) Analysis for Self Heating

Figure 9:
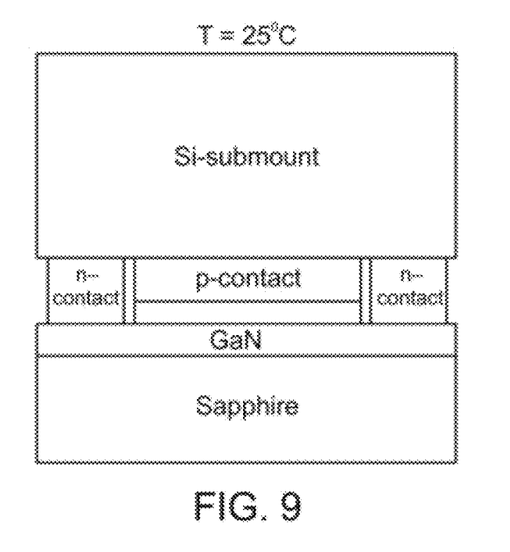
FIG. 9 is a schematic of a flip-chip light emitting device on a sapphire substrate.
Figure 10A:
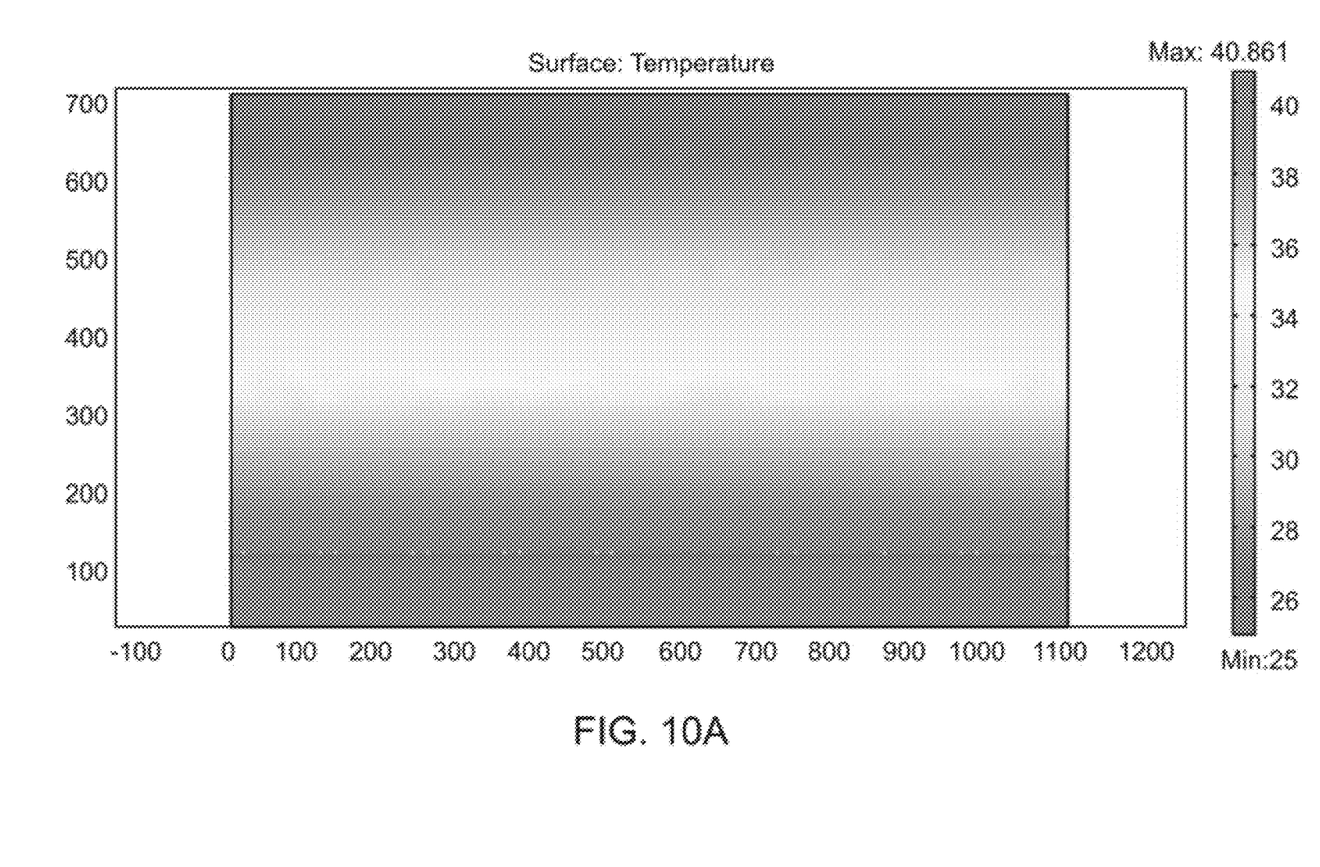
FIG. 10A is a graph illustrating the temperature distribution inside (A) an IMPA light emitting device and FIG. 10B is a graph illustrating a conventional single square-shaped light emitting device with the same active area (L=900 μm) under a drive current of 1 Amp.
Figure 10B:
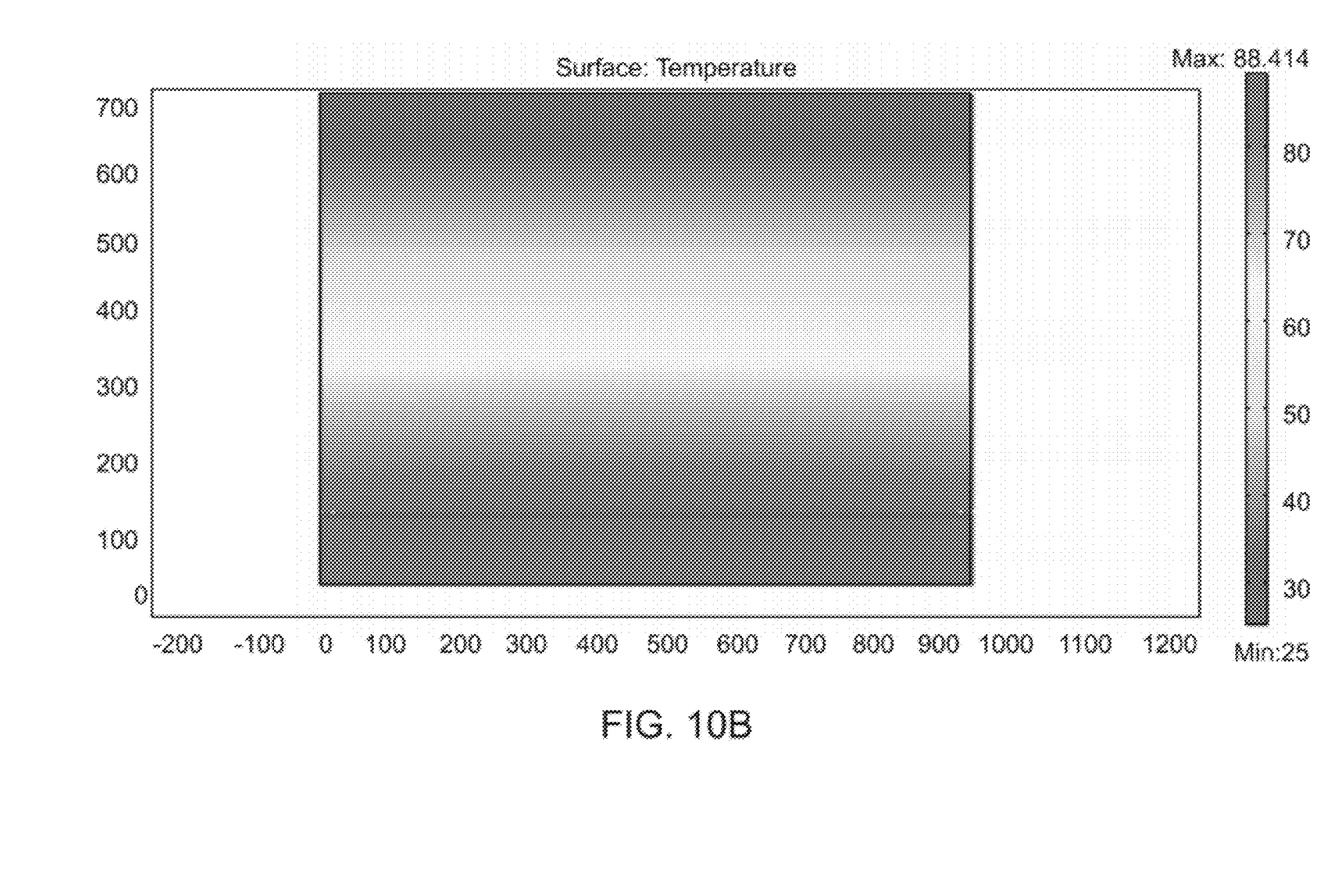
Figure 11:
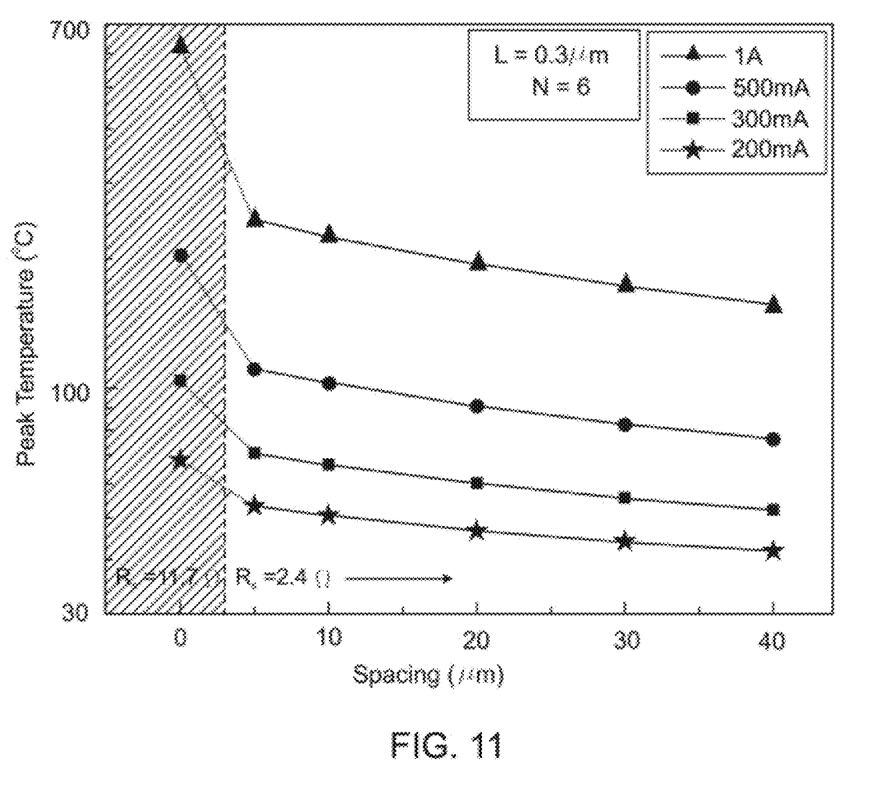
FIG. 11 is a graph illustrating the junction temperature of 300×300 μm² IMPA light emitting device as a function of inter-pixel spacing (d), wherein the shaded region indicates the temperature of conventional square-shaped light emitting device under the same drive current.

The temperature distribution inside the interdigitated multi-pixel light-emitting device was studied by means of thermal simulation assuming steady-state heat conduction. The results were compared to those of a conventional single square-shaped light-emitting device. FEMLAB was used to solve the steady-state heat diffusion equation in 2-D. Joule heating in the light-emitting device was assumed to be the heat source and a flip-chip light-emitting device design was considered. The light-emitting device structure assumed in the simulation (shown in FIG. 9) was comprised of a 100 µm thick sapphire substrate, 4 µm of GaN buffer followed by 1 µm of active region acting as the heat source. Thick metals were used as the solder. Si of thickness 600 µm was used as the submount and it was assumed that the free boundary of the Si submount was at 25° C. The temperature distribution inside an IMPA light-emitting device and a conventional single square-shaped light-emitting device with the same active area (L=900 µm) and under the same drive current (1 A) is shown in FIGS. 10A and 10B. It can be seen that the temperature inside the IMPA light-emitting device (40° C.) is less than half compared to the temperature of the square-shaped light-emitting device (88° C.). In FIG. 11, we have plotted the junction temperature of 300×300 µm² IMPA light-emitting device with different spacing (d), spacing d=0 being a conventional single square-shaped light-emitting device (shown by the shaded region). It was observed that there is a significant reduction in the junction temperature on increasing the spacing from d=0 to d=5 µm This improvement is mainly due to the decrease in the series resistance by implementing IMPA geometry. However, the decrease in the junction temperature for d≧5 µm is due the presence of available area which helps to dissipate the heat generated in the individual pixels. For our actual designs, we have adopted a d=20 µm in order to allow enough space for the n-contact stubs between the pixels.

(IV) Fabrication Process

Figure 12:
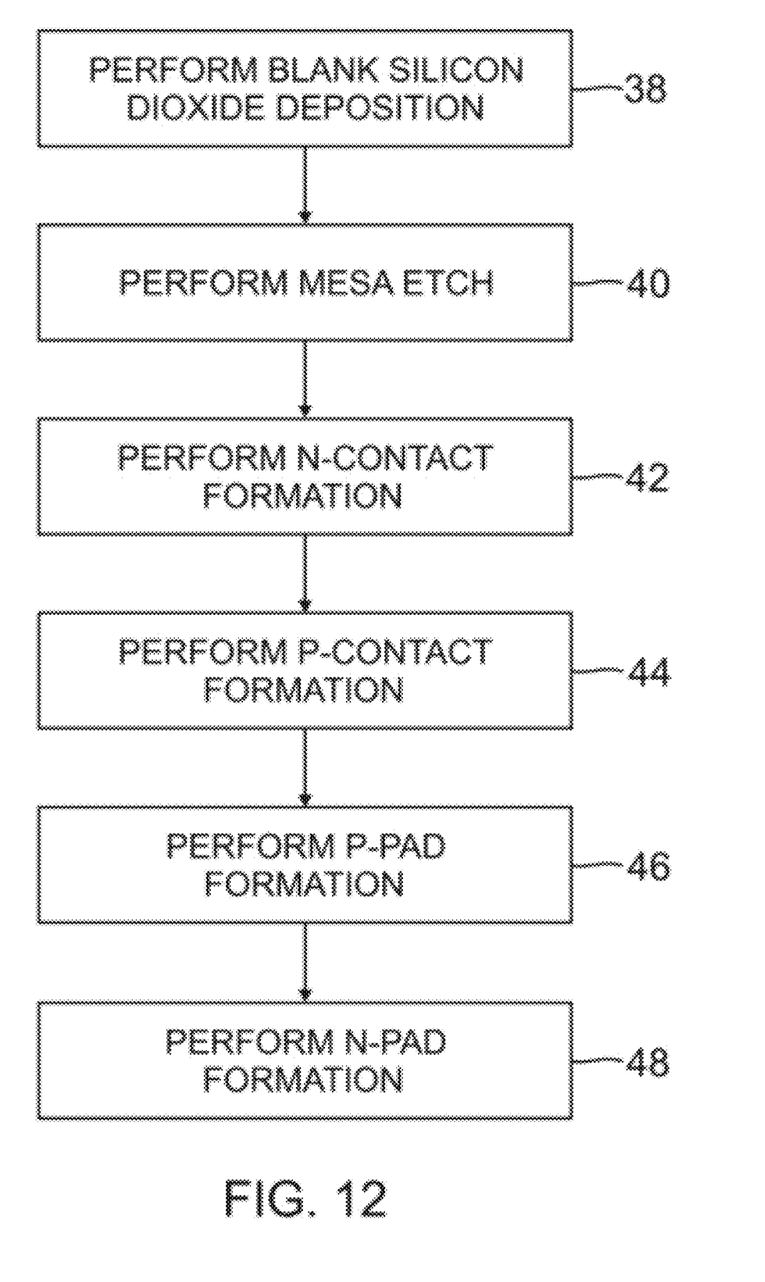
FIG. 12 is a flow chart that illustrates the steps performed in the processing flow to fabricated nitride-based light emitting diodes according to the preferred embodiment of the present invention.

FIG. 12 is a flow chart that illustrates the steps performed in the processing flow to fabricate nitride-based light emitting diodes according to the preferred embodiment of the present invention. Specifically, the flow chart illustrates a method of fabricating a light-emitting device, comprising the step of fabricating a plurality of interdigitated pixels arranged in an array, with very low series-resistances and high brightness output, wherein each pixel is a light emitting diode and a light emitting surface comprises either a top or bottom of the device.

Block 38 represents the step of performing a blank $SiO_2$ deposition (150 nm) to protect the p-type aluminum gallium nitride (AlGaN) surface.

Block 40 represents the step of performing a mesa etch.

Block 42 represents the step of performing n-contact formation. In the preferred embodiment, this step includes the deposition of the following layers: 20 nm of titanium (Ti), 240 nm of aluminum (Al), 20 nm of nickel (Ni), and 50 nm of gold (Au), in that order, and then annealing the layers at 870° C. for 30 seconds.

Block 44 represents the step of performing a p-contact formation. In the preferred embodiment, this step includes an $SiO_2$ wet etch; followed by the deposition of the following layers: 5 nm of Ni and 5 nm of Au, in that order.

Block 46 represents the step of performing p-pad formation. In the preferred embodiment, this step includes the deposition of the following layers: 20 nm of Ti and 400 nm of Au, in that order.

Block 48 represents the step of performing n-pad formation. In the preferred embodiment, this step includes the deposition of 20 nm of Ti and 400 nm of Au, in that order.

(V) Key Features

Note that the technical description described above includes several key features relevant to the fabrication of different kinds of light emitting devices. These key features include:

1. In the preferred embodiments, the quantum wells can comprise any semiconductor.
2. It can be applied to both front-side as well as backside vertical light-emitting devices.
3. Use of multi-pixel array of similar active area as a single square shaped geometry, to increase the perimeter to reduce the series resistance.
4. Smaller individual pixels (smaller pixel area) prevent the current crowding problem by having uniform current distribution throughout the small area.
5. Use lithography techniques with resolution of 1 µm or less to reduce the separation between the mesa and the n-contact for lowering the series resistance.
6. Have the pixels separated from each other facilitate heat sinking
7. Scale the inter-pixel separation with the individual pixel size for better thermal management.
8. Have interdigitated geometry for better contact scheme.

(VI) Possible Modifications and Variations

The following describes possible modifications and variations of the invention:

1. The present invention can be used with any semiconductor light-emitting device.
2. Different pixel sizes and different pixel arrays can be used to improve heat sinking and maximize the output power.
3. Different pixel geometry like circular, hexagonal, rectangular, etc., can also be used.
4. Spacing between the pixels can be changed to improve the heat sinking
5. Can be applied to flip-chipbonded light emitting devices.

(VII) Advantages and Improvements

The key features identified above constitute the most critical and novel elements in the design of the interdigitated multi-pixel array mask for light emitting device design.

The present invention minimizes the series resistance mainly by shrinking the space between the mesa and the n-contact as well as increasing the perimeter of the active regions. This is the biggest advantage of the present mask design over other multi-pixel designs. (See, e.g., Appl. Phys. Lett. 85, 1838 (2004), which is incorporated by reference herein).

Further, the multi-pixel geometry also has lower series resistance compared to a single stripe-shaped geometry of similar area. This is because the resistance of thin p-contact layer for the long stripe geometry is much larger than the metal resistance of the distributed pixels.

In the present invention, an attempt has been made to improve the heat sinking by having a distributed array of pixels. Different pixel sizes and inter-pixel separations have been used. Such a distributed array of pixels is very important for thermal management of light-emitters operating at very high CW drive-current levels. The heat generated as a result of Joule heating needs to get dissipated within the wafer for improved performance at CW operations.

Figure 13:
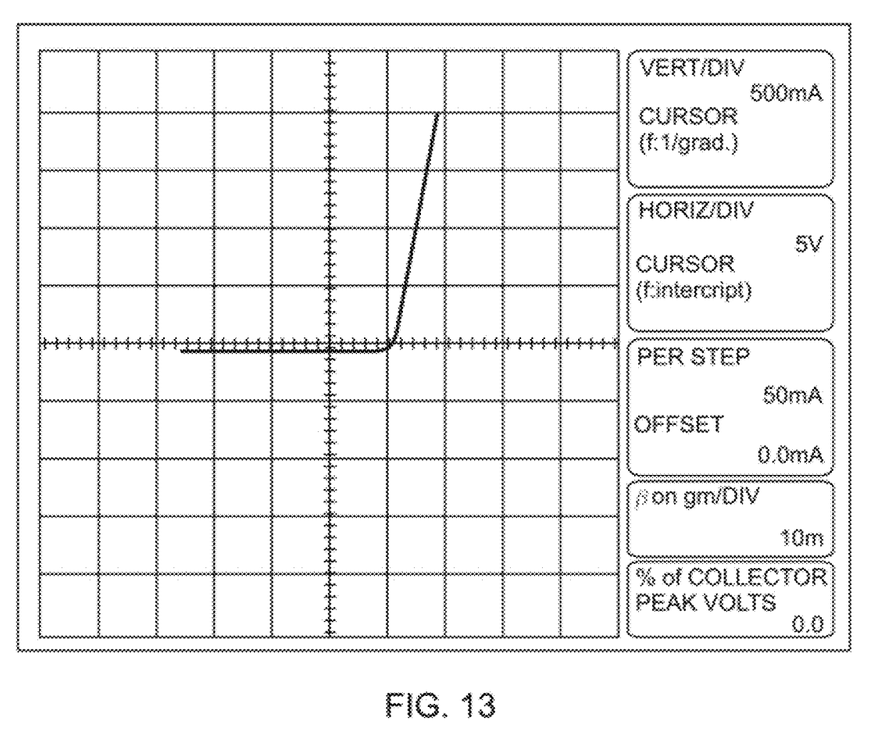
FIG. 13 is a display of an I-V curve from a curve tracer using a mask on a 275 nm deep-UV light emitting device, according to the preferred embodiment of the present invention.

Finally, the use of the present invention has enabled, for the first time, the fabrication of a deep-UV light-emitting device with a series resistance as low as 2 Ohm and blue light-emitting device with series resistance as low as 0.5 Ohm, for 300 micron device, and that allows operating the device at 3.5 Amps direct current. FIG. 13 is a graph illustrating an I-V curve from a curve tracer using a mask on a 275 nm deep-UV light-emitting device, according to the preferred embodiment of the present invention. The device had excellent thermal stability under high-current CW operation. Also, it was possible to drive 3.5 Amps through a 200 micron device for more than 1 minute without any degradation.

REFERENCES

The following references are incorporated by reference herein:

Publications

1. S. Nakamura and G. Fasol, The Blue Laser Diodes, (Springer, Heidelberg, 1997).
2. E. F. Schubert, Light-Emitting Diodes (Cambridge, 2003).
3. A. Žukauskas, M. S. Shur, and R. Gaska, Introduction to Solid-State Lighting, (John Wiley & Sons, 2002).
4. M. R. Krames et al., Proceedings of SPIE, 3938, 2 (2000).
5. R. Zheng and T. Taguchi, Proceedings of SPIE, 4996, 105 (2003).
6. M. Arik and S. Weaver, Proceedings of SPIE, 5530, 214 (2004).
7. X. Gao and E. F. Schubert, Appl. Phys. Lett., 78, 3337 (2001).
8. X. Gao, Y. L. Li, and E. F. Schubert, Appl. Phys. Lett., 79, 1936 (2001).
9. S. X. Jin, J. Li, J. Z. Li, J. Y. Lin, and H. X. Jiang, Appl. Phys. Lett., 76, 631 (2000).
10. A. Chakraborty, L. Shen, and U. K. Mishra, "Current Spreading in Lateral LEDs with Semi-transparent p-Contacts," (unpublished).
11. V. Adivarahan, S. Wu, W. H. Sun, V. Mandavilli, M. S. Shatalov, G. Simin, J. W. Yang, H. P. Maruska, and M. A. Khan, "High-power deep ultraviolet light-emitting diodes based on a micro-pixel design," Appl. Phys. Lett., Vol. 85, pp. 1838 (2004).
12. C. G. Moe, H. Masui, M. C. Schmidt, L. Shen, B. Moran, S. Newman, K. Vampola, T. Mates, S. Keller, J. S. Speck, S. P. DenBaars, C. Hussel and D. Emerson, "Milliwatt Power Deep Ultraviolet Light Emitting Diodes Grown on Silicon Carbide," J. Jap. Appl. Phys., Vol. 44, pp. 502 (2005).

| U.S. Patents | | |
|---|---|---|
| U.S. Pat. No. | Issue Date | Inventor |
| 5,173,751 | December 1992 | Ota et al. |
| 5,247,533 | September 1993 | Okazaki et al. |
| 5,338,944 | August 1994 | Edmond et al. |
| 5,387,804 | February 1995 | Suzuki et al. |
| 5,408,120 | April 1995 | Manabe et al. |
| 5,523,589 | June 1996 | Edmond et al. |
| 5,585,648 | December 1996 | Tischler |
| 5,592,501 | January 1997 | Edmond et al. |
| 5,631,190 | May 1997 | Negley |
| 5,661,074 | August 1997 | Tischler |
| 5,670,798 | September 1997 | Schetzina |
| 5,739,554 | April 1998 | Edmond et al. |
| 5,747,832 | May 1998 | Nakamura et al. |
| 5,751,752 | May 1998 | Shakuda |
| 5,862,167 | January 1999 | Sassa et al. |
| 5,874,747 | February 1999 | Redwing et al. |
| 5,880,491 | March 1999 | Soref et al. |
| 5,900,647 | May 1999 | Inoguchi |
| 5,987,048 | November 1999 | Ishikawa et al. |
| 6,028,877 | February, 2000 | Kimura |
| 6,046,464 | April, 2000 | Schetzina |
| 6,067,310 | May, 2000 | Hashimoto et al. |
| RE36747 | June, 2000 | Manabe et al. |
| 6,072,189 | June, 2000 | Duggan |
| 6,072,819 | June, 2000 | Shakuda |
| 6,078,064 | June, 2000 | Ming-Jiunn et al. |
| 6,084,899 | July, 2000 | Shakuda |
| 6,118,801 | September, 2000 | Ishikawa et al. |

| Foreign Patent Documents | | |
|---|---|---|
| Publn. Number | Date | Type |
| 0 817 283 | January 1998 | EP |
| 2 343 294 | May, 2000 | GB |
| WO99/18617 | April 1999 | WO |

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A light-emitting device, comprising:
   at least one pixel, wherein the pixel is a light emitting diode; and
   a p-bus and an n-bus for providing current to the pixel, wherein the p-bus, the n-bus, or both the p-bus and the n-bus has an interdigitated geometry for providing the current to the pixel.

2. The device of claim 1, wherein the interdigitated geometry includes at least one set of fingers feeding the current to the pixel.

3. The device of claim 2, wherein there are a plurality of the pixels are arranged in an array, and the interdigitated geometry includes a first set of fingers feeding the current into rows of the pixels in the array and a second set of fingers feeding the current into the pixels within each row of the array.

4. The device of claim 2, wherein heat-sinking is improved by separating the pixels by a specified distance.

5. The device of claim 2, wherein current spreading is improved by shrinking the pixels' size.

6. The device of claim 2, wherein lateral current spreading is improved using an interdigitated multi-pixel array (IMPA) geometry for the pixels.

7. The device of claim 1, wherein light extraction is improved using transparent conducting oxide contacts.

8. The device of claim 1, wherein the light emitting diode comprises an n-contact surrounding a mesa from at least three sides, the mesa being comprised of one or more each of n-layers, active layers, and p-layers, and the mesa having at least a semi-transparent p-contact thereon.

9. The device of claim 8, wherein series resistance is minimized by increasing the active layers' perimeter.

10. The device of claim 8, wherein series resistance is minimized by shrinking space between the mesa and the n-contact.

11. The device of claim 1, wherein the device is a flip-chip light emitting device.

12. A method of fabricating light-emitting device, comprising:
fabricating at least one pixel, wherein the pixel is a light emitting diode; and
fabricating a p-bus and an n-bus for providing current to the pixel, wherein the p-bus, the n-bus, or both the p-bus and the n-bus has an interdigitated geometry for providing the current to the pixel.

13. The method of claim 12, wherein the interdigitated geometry includes at least one set of fingers feeding the current to the pixel.

14. The method of claim 13, wherein there are a plurality of the pixels are arranged in an array, and the interdigitated geometry includes a first set of fingers feeding the current into rows of the pixels in the array and a second set of fingers feeding the current into the pixels within each row of the array.

15. The method of claim 13, wherein heat-sinking is improved by separating the pixels by a specified distance.

16. The method of claim 13, wherein current spreading is improved by shrinking the pixels' size.

17. The method of claim 13, wherein lateral current spreading is improved using an interdigitated multi-pixel array (IMPA) geometry for the pixels.

18. The method of claim 12, wherein light extraction is improved using transparent conducting oxide contacts.

19. The method of claim 12, wherein the light emitting diode comprises an n-contact surrounding a mesa from at least three sides, the mesa being comprised of one or more each of n-layers, active layers, and p-layers, and the mesa having at least a semi-transparent p-contact thereon.

20. The method of claim 19, wherein series resistance is minimized by increasing the active layers' perimeter.

21. The method of claim 19, wherein series resistance is minimized by shrinking space between the mesa and the n-contact.

22. The method of claim 12, wherein the device is a flip-chip light emitting device.

23. A device fabricated according to the method of claim 12.

* * * * *